US010106399B1

(12) United States Patent
Lee et al.

(10) Patent No.: US 10,106,399 B1
(45) Date of Patent: Oct. 23, 2018

(54) MULTI-LAYER SINGLE CHIP MEMS WLCSP FABRICATION

(71) Applicant: mCube, Inc., San Jose, CA (US)

(72) Inventors: Chien Chen Lee, San Jose, CA (US); Tzu Feng Chang, San Jose, CA (US)

(73) Assignee: MCUBE, INC., San Jose, CA (US)

( * ) Notice: Subject to any disclaimer, the term of this patent is extended or adjusted under 35 U.S.C. 154(b) by 0 days.

(21) Appl. No.: 15/787,532

(22) Filed: Oct. 18, 2017

Related U.S. Application Data

(60) Provisional application No. 62/410,981, filed on Oct. 21, 2016.

(51) Int. Cl.
*B81C 1/00* (2006.01)

(52) U.S. Cl.
CPC ........ *B81C 1/00896* (2013.01); *B81C 1/0023* (2013.01); *B81C 1/00246* (2013.01); *B81C 1/00261* (2013.01); *B81C 1/00269* (2013.01); *B81C 2203/0109* (2013.01); *B81C 2203/0118* (2013.01)

(58) Field of Classification Search
CPC ............ B81C 1/00261; B81C 1/00246; B81C 1/0023; B81C 1/00269; B81C 2203/0109; B81C 2203/0118
See application file for complete search history.

*Primary Examiner* — Selim Ahmed
*Assistant Examiner* — Evan Clinton
(74) *Attorney, Agent, or Firm* — Richard T. Ogawa; Ogawa P.C.

(57) ABSTRACT

A method for fabricating a WLCSP device includes receiving a MEMS cap wafer having a first radius, a MEMS device wafer having a second radius, and a CMOS substrate wafer having a third radius, wherein the first radius is smaller than the second radius, and wherein the second radius is smaller than the third radius, disposing the MEMS cap wafer approximately concentrically upon the MEMS device wafer, disposing the MEMS device wafer approximately concentrically upon the CMOS substrate wafer, disposing a spacer structure upon the MEMS device wafer, wherein the spacer structure comprises a plurality of proximity spacers disposed upon a proximity flag, wherein the plurality of proximity spacers are disposed upon the MEMS device wafer, disposing a mask layer in contact to the plurality of proximity spacers, above and substantially parallel to the MEMS cap wafer, and forming a pattern upon the MEMS cap wafer using the mask layer.

20 Claims, 5 Drawing Sheets

MULTI-LAYER SINGLE CHIP MEMS WLCSP FABRICATION

CROSS-REFERENCE TO RELATED APPLICATIONS

The present invention is a non-provisional of U.S. Patent Application No. 62/410,981 filed Oct. 21, 2016. That application is herein by incorporated by reference in its entirety, for all purposes.

BACKGROUND

The present invention relates to fabrication of integrated MEMS devices. More specifically, the present invention relates to fabrication of wafer level chip scale packaging (WLCSP) integrated MEMS devices.

The inventors of the present invention have experimented with a number of techniques for fabricating WLCSP MEMS devices. Based upon their experiments, a number of problems with the formation of WLCSP MEMS devices were discovered, as detailed herein.

In light of the above, what is desired are improved methods and apparatus for improved WLCSP MEMS fabrication with reduced drawbacks.

SUMMARY

Embodiments of the present invention are directed towards methods and apparatus for fabrication of multi-layer wafer level chip scale packaging of MEMS devices.

According to one aspect of the invention, a method for fabricating a multi-layer wafer level chip scale package for MEMS devices is disclosed. One technique includes receiving a MEMS cap wafer comprising a plurality of MEMS capping structures, a MEMS device wafer comprising a plurality of MEMS dies, and a CMOS substrate wafer comprising a plurality of CMOS dies, wherein the CMOS substrate wafer is characterized by a first radius, wherein the MEMS device layer is characterized by a second radius, and wherein the MEMS cap wafer is characterized by a third radius, wherein the first radius is greater than the second radius, and wherein the second radius is greater than the third radius. A process may include forming a multi-layer wafer comprising the MEMS cap wafer disposed approximately concentrically upon the MEMS device wafer, and the MEMS device wafer disposed approximately concentrically upon the CMOS substrate wafer, wherein a MEMS device comprises a MEMS capping structure, a MEMS die and a CMOS die, and disposing a spacer structure upon the multi-layer wafer, wherein the spacer structure comprises a plurality of proximity spacers disposed upon a proximity flag, wherein the plurality of proximity spacers are disposed upon the MEMS device layer. A fabrication method may include disposing a mask layer above and substantially parallel to the MEMS cap wafer, wherein the mask layer is disposed upon the plurality of proximity spacers and forming a pattern upon the MEMS cap wafer using the mask layer.

According to another aspect of the invention, a method for wafer level chip scale packages for MEMS devices is disclosed. A technique may include receiving a CMOS substrate wafer comprising a plurality of CMOS dies, wherein the CMOS substrate wafer is characterized by a first radius; receiving a MEMS device wafer comprising a plurality of MEMS dies, wherein the MEMS device wafer is characterized by a second radius, and wherein the first radius exceeds the second radius; and disposing the MEMS device wafer approximately concentrically upon the CMOS substrate wafer. A process may include receiving a MEMS cap wafer comprising a plurality of MEMS capping structures, wherein the MEMS cap wafer is characterized by a third radius, and wherein the second radius exceeds the third radius, and disposing the MEMS cap wafer approximately concentrically upon the MEMS device wafer, wherein a portion of the MEMS device wafer remains exposed. Steps may include disposing a spacer structure in contact with the portion of the MEMS device wafer, disposing a first mask pattern above the MEMS cap wafer but not in contact therewith, wherein the first mask pattern contacts the spacer structure, and forming a metallization layer upon the MEMS cap wafer using the first mask pattern. In some embodiments, a MEMS device comprises a CMOS die, a MEMS die, and a MEMS capping structure.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION

Figure 1A:
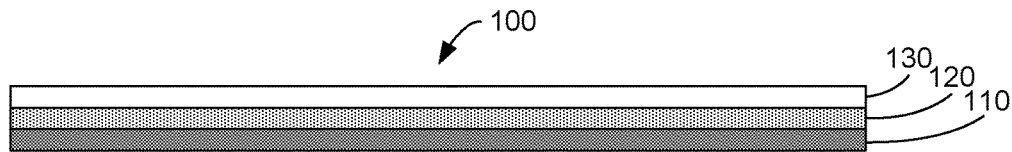
FIGS. 1A-C illustrate embodiments of the present invention including various configurations of a multilayer WLCSP.
Figure 1B:
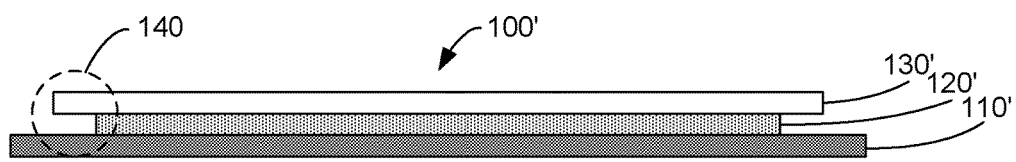
Figure 1C:
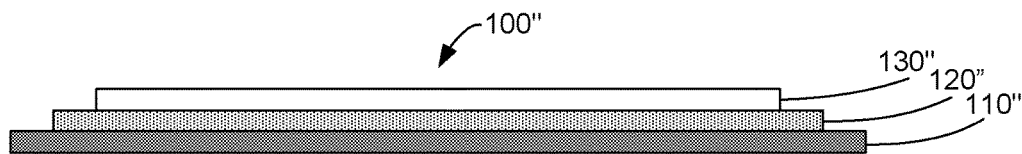

FIGS. 1A-C illustrate embodiments of the present invention including various configurations of a multilayer WLCSP. For example, in FIG. 1A, WLCSP 100 is shown including a CMOS layer (wafer) 110, a MEMS layer (wafer) 120 and a MEMS cap layer (wafer) 130. In various embodiments, CMOS layer 110 comprises a plurality of CMOS devices formed upon a semiconductor substrate, e.g. silicon. In some examples, the plurality of CMOS devices form one or more sensing and control circuitry for MEMS devices formed with MEMS layer 120. In various embodiments, MEMS layer 120 comprises MEMS devices formed within a MEMS substrate material such as silicon. In various examples, MEMS devices may include an accelerometer, a gyroscope, a pressure sensor, or the like. Typically, the MEMS devices within MEMS layer 120 are electrically coupled to one or more CMOS devices formed upon CMOS layer 110. In various embodiments, MEMS cap layer 130 is disposed above MEMS layer 110. MEMS cap layer typically provides a top cover or surface to a cavity inside which the MEMS device operates. In additional embodiments, MEMS cap layer 130 also provides a surface for the formation of one or more external interconnections, e.g. solder balls, for WLCSP 100. In various examples, MEMS cap layer 130 is formed of a semiconductor or insulating material such as silicon.

The embodiment in FIG. 1A illustrates the use of virtually identically sized wafers, e.g. CMOS layer 110, MEMS layer 120 and MEMS cap layer 130 for formation of WLCSP 100. Using such embodiments, the inventors have determined that there may be poor bonding quality at the edges of CMOS wafer 110 and MEMS wafer 120. Accordingly the inventors have proposed using different-sized wafers, as illustrated in FIGS. 1B and 1C.

In the example in FIG. 1B, a WLCSP 100' is illustrated including a CMOS layer 110', a MEMS layer 120' and a MEMS cap layer 130', as described above. As can be seen, MEMS layer 120' and MEMS cap layer 130' have a smaller diameter than CMOS layer 110', with MEMS layer 120' having a smaller diameter than MEMS cap layer 130'. Using such embodiments, the inventors have determined that although there is better quality bonding at the edges of CMOS wafer 110' and MEMS wafer 120', other drawbacks may arise. One drawback is that after a grinding process upon MEMS cap layer 130' there may be thickness variations in MEMS cap layer 130' especially in the overhang region 140.

In the example in FIG. 1C, a WLCSP 100" is illustrated including a CMOS layer 110", a MEMS layer 120" and a MEMS cap layer 130", as described above. As can be seen, MEMS layer 120" has a smaller diameter than CMOS layer 110", and MEMS cap layer 130" has a smaller diameter than both CMOS layer 110" and MEMS layer 120". The inventors have determined that such embodiments reduce the drawbacks discussed above. As will be seen in the figures below, the embodiment in FIG. 1C also provides additional benefits.

Figure 2:
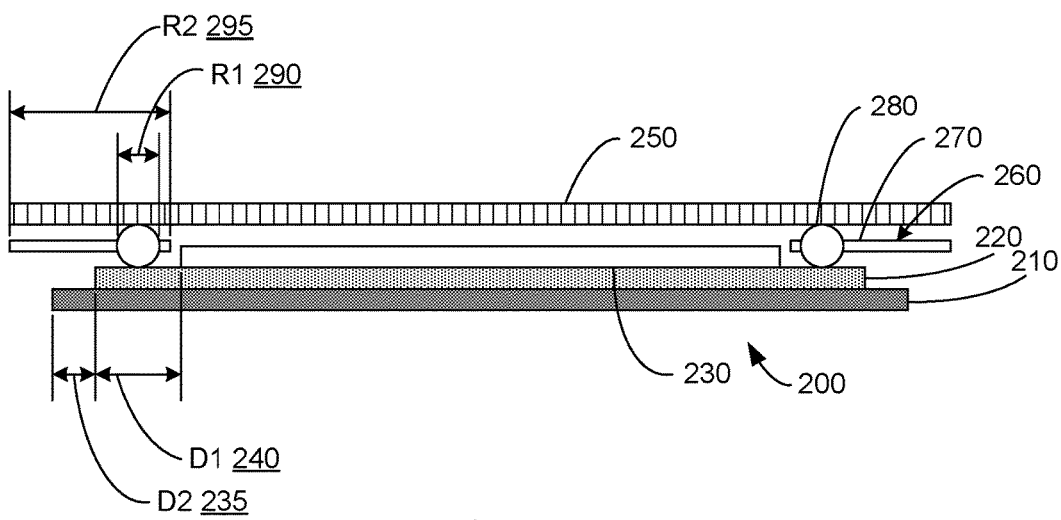
FIG. 2 illustrates various embodiments of the present invention.

FIG. 2 illustrates various embodiments of the present invention. More specifically, a WLCSP 200 is shown, including CMOS layer 210, a MEMS layer 220 and a MEMS cap layer 230, having geometric relationships similar to that shown in FIG. 1C. In FIG. 2, CMOS layer 210 is shown to have a smaller wafer radius compared to MEMS layer 220 by dimension D2 235, and MEMS cap layer 230 is shown to have a smaller wafer radius compared to MEMS cap layer 230 by dimension D1 240.

Also illustrated in FIG. 2 are a wafer mask 250, and a wafer mask spacer structure 260. In various embodiments, wafer mask 250 is use to facilitate formation of a mask-layer material upon a top surface of MEMS cap layer 230. In some examples, multiple wafer masks 250 may be used for different purposes, such as superimposing wafer scribe lines, metal interconnects, solder ball sites, or the like upon MEMS cap layer 230. In embodiments where wafer mask 250 is not properly supported above MEMS cap layer 230, the inventors have seen problems such as mask mis-alignment and mask shifting. In some embodiments of FIG. 2, a metal layer or other material layers and a (photo sensitive) masking material may be disposed upon MEMS cap layer 230 prior to wafer mask 250 being positioned above MEMS cap layer 230.

In various embodiments, wafer mask 250 should be physically close or near to MEMS cap layer 230, but not so close so as to physically touch or damage the top surface of MEMS cap layer 230. Accordingly, spacer structure 260 is provided to support and separate wafer mask 250 from WLCSP 200. In FIG. 2, a spacer structure 260 is illustrated having multiple flag structures 270, each having a spacer 280 disposed thereon. In various embodiments, multiple flag structures 270 may be made of any conventional material, such as aluminum, titanium, a metal alloy, or the like. In various embodiments, spacer 280 may be disposed upon the end of flag structures 270 or along flag structure 270, as illustrated. Spacer 280 may have different shapes, such as ovoid, spherical, cylindrical, prismatic, or the like. Spacer 280 may be made of conventional materials, such as rubber, Teflon, or the like.

In the embodiment illustrated in FIG. 2, spacer 280 is characterized by a width R1 290 and flag structure 270 is characterized by a length R2 295. As shown, spacer 280 contacts MEMS layer 220 and supports wafer mask 250 above MEMS cap layer 230. In various embodiments, width R1 290 of spacer 280 is designed to be less than dimension D1 240. Additionally, length R2 295 of flag structure 270 is designed to be greater than the sum of dimension D2 235 and dimension D1 240. Such embodiments help ensure spacer structure 260 (e.g. flag structure 270 and spacer 280) does not substantially contact MEMS cap layer 230. Further, such embodiments provide a firm coupling between wafer mask 250 and WLCSP 200 to thereby reduce mask misalignment issue; mask shifting problems; and the like.

In various embodiments of FIG. 2, a metal layer or other material layers and a (photo sensitive) masking material, not expressly shown, may be disposed upon MEMS cap layer 230 prior to wafer mask 250 being positioned above MEMS cap layer 230. In some embodiments, wafer mask 250 may be used to selectively expose the photosensitive masking material to light (e.g. UV, visible light) to form patterns upon a material layer. Subsequently, using conventional etching techniques, the material layer may be patterned according to the patterns specified by wafer mask 250. The patterns formed by the material layer may indicate boundaries between MEMS devices or dies, scribe lines, alignment marks, metalization lines, solder ball formation sites, or the like.

Figure 3A:
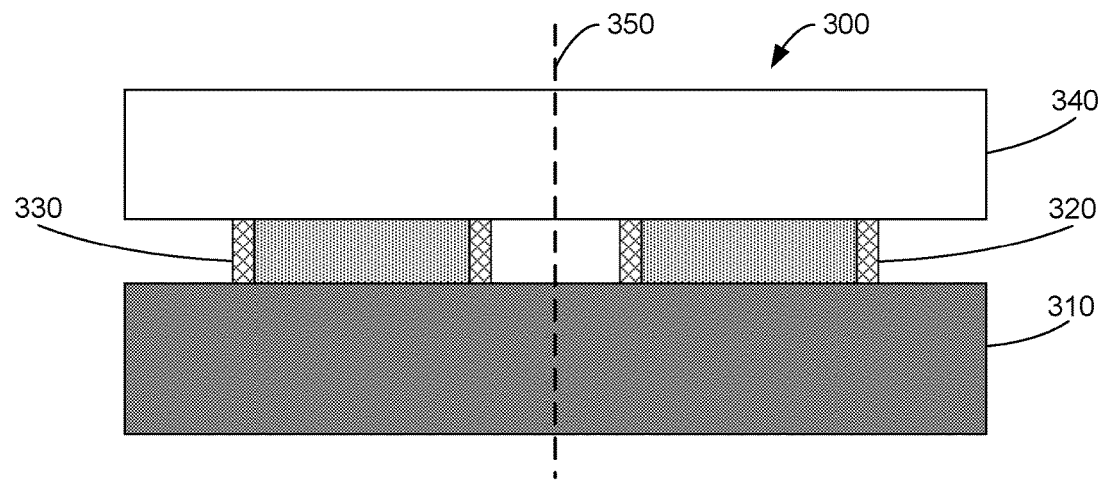
FIG. 3A-B illustrates various embodiments of the present invention.
Figure 3B:
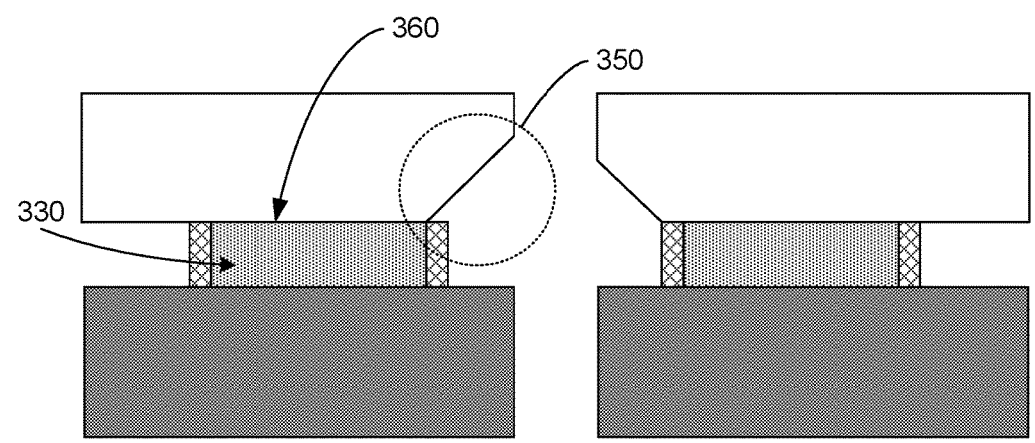

FIG. 3A-B illustrates various embodiments of the present invention. More specifically, FIG. 3A-B illustrate additional fabrication problems determined by the inventors with multi-layer single chip MEMS WLCSP devices, for example illustrated in FIG. 2. In FIGS. 3A-B, a close-up of a WLCSP 300 is illustrated including a CMOS substrate 310, a first MEMS device 320, a second MEMS device 330 (derived from a MEMS layer), and a MEMS cap layer 340. Also illustrated is a wafer scribe line 350 representing the desired singulation line between adjacent WLCSP devices of WLCSP 300.

In FIG. 3B, the inventors have determined that in some instances a result of the singulation process, e.g. via a wafer saw, the MEMS cap layer 340 may be chipped. In some cases, the edge chipping 350 is so extensive so as to impact the bonding between CMOS substrate 310, first MEMS device 320 and or MEMS cap layer 340. In the example in FIG. 3B, the integrity of a MEMS cavity 360 has been breached rendering second MEMS device 330 defective.

Figure 4A:
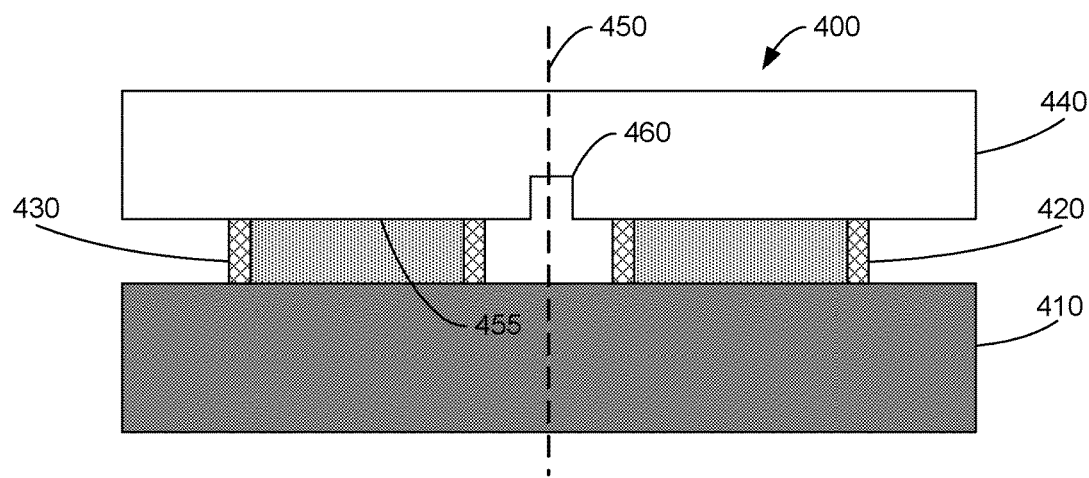
FIGS. 4A-D illustrates various embodiments of the present invention.
Figure 4B:
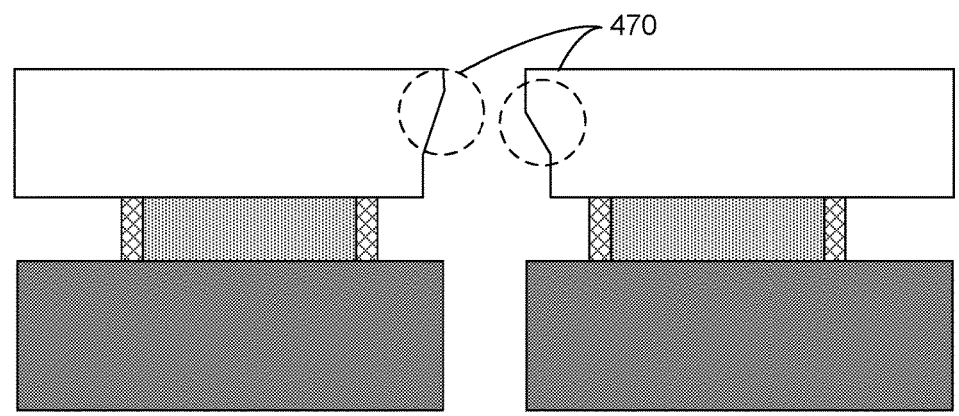

FIGS. 4A-D illustrates various embodiments of the present invention. In FIGS. 4A-B, a close-up of a WLCSP 400 is illustrated including a CMOS substrate 410, MEMS devices 420 and 430 (derived from a MEMS layer), a MEMS cap layer 440, and a wafer scribe line 450 representing the desired singulation line between adjacent WLCSP devices of WLCSP 400. In this embodiment, prior to bonding MEMS cap layer 400 to the MEMS layer, grooves, such as groove 460, are formed within MEMS cap layer 400 at locations where the WLCSP devices should be separated. In various embodiments, the grooves may be etched into the bottom surface of MEMS cap layer 440 via conventional semiconductor techniques, e.g. wet etch, dry etch, combination of wet and dry etch, etc. In other embodiments, grooves may be physically formed via a wafer saw, a pressurized-water saw, scribe or the like.

As illustrated in FIG. 4A, the groove or grooves on the bottom surface of MEMS cap layer 440 are then flipped so that they provide the top surface 455 of MEMS cavities for MEMS devices 420 and 430 and are substantially aligned with the desired singulation line 450. In practice, as shown in FIG. 4B, chipping 470 as a result of the singulation process (e.g. wafer saw) is typically confined to the area of groove 460.

Figure 4C:
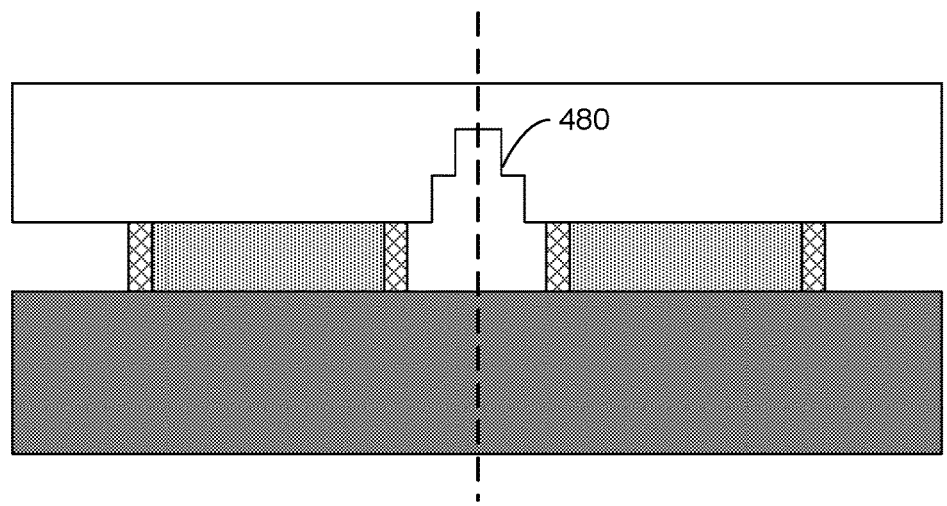
Figure 4D:
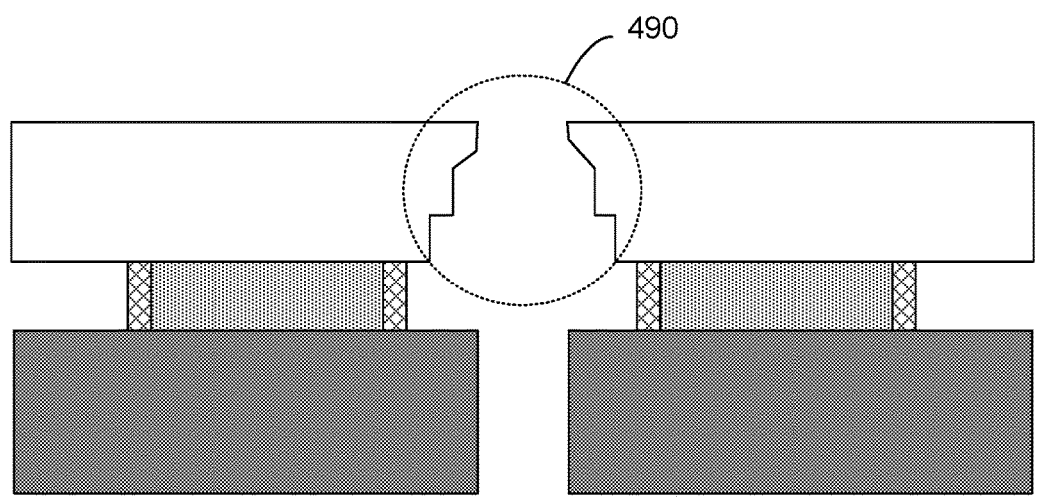

FIGS. 4C-D illustrate another example where a series of grooves 480 are provided. As can be seen in FIG. 4D, chipping 490 is also confined to the area about grooves 480, and the integrity of the MEMS devices is maintained. In various embodiments, a purpose of grooves 460, 480 or the like formed within MEMS cap wafer structure, e.g. 440, is to reduce or to prevent chipping, e.g. within region 470 and 490 from reaching or touch the MEMS devices, e.g. 320/330 or 420/430, during the wafer saw process. Such embodiments help keep the integrity of MEMS cap bonding area in each MEMS device.

Figure 5:
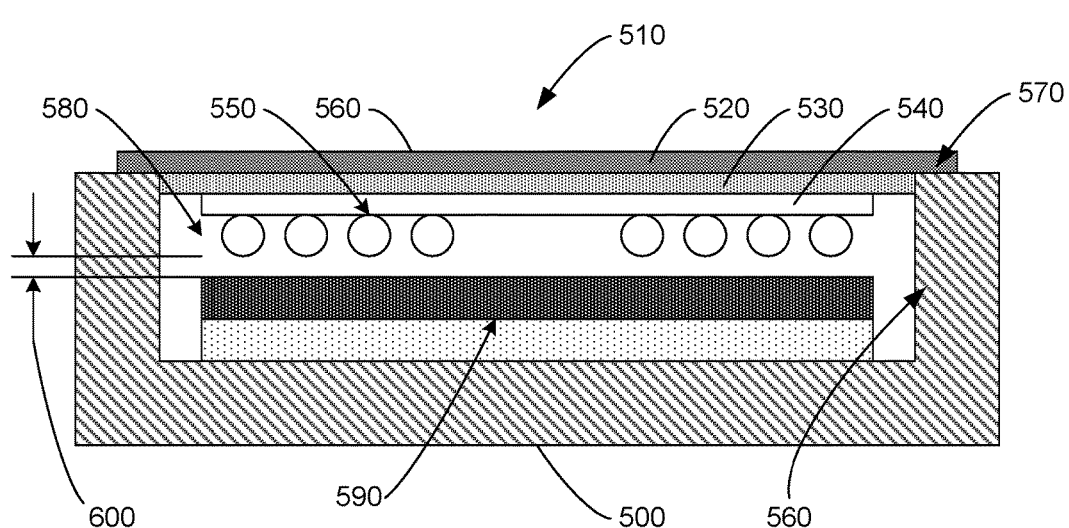
FIG. 5 illustrates another embodiment of the present invention.

FIG. 5 illustrates another embodiment of the present invention. More specifically, FIG. 5 illustrates another problem discovered by the inventors of the present invention while manufacturing single chip MEMS using WLCSP fabrication techniques. In FIG. 5, an assembly 500 is illustrated coupled to a WLCSP wafer i.e. 510, both not to scale. As described above, WLCSP wafer 510 includes a substrate 520, a MEMS layer 530, and an MEMS capping layer 540. In various embodiments, a number of solder balls 550 (again not to scale) are illustrated disposed upon MEMS capping layer 540. These solder balls 550 are typically coupled to CMOS circuitry formed within substrate 520 and to MEMS devices formed within MEMS layer 530.

As illustrated in FIG. 5, a backside 560 of substrate 520 is exposed within assembly 500. In various embodiments, substrate 520 is ground-down or thinned prior to singulating the MEMS devices, and encapsulating the MEMS devices (leaving the solder balls 550 exposed). Another process may include coating backside 560 with one or more sealant materials. The inventors believe that these processes help increase the reliability of the devices.

In FIG. 5, assembly 500 has sidewalls 560 that support edge regions 570 of substrate 520. In various embodiments, an interior region 580 of assembly 500 is formed and includes layers 590 of a soft material, such as rubber, silicone, or the like. Additionally, interior region 580 and layers 590 have a depth 600 that is sufficient to inhibit solder balls 550 from touching layers 590. In various embodiments, the distance 610 is typically greater than zero and less than 50 microns. In light of the above, when backside 560 of substrate 520 is processed, e.g. ground-down, smoothed, coated, or the like, the forces placed upon substrate 520 do not appreciably cause solder balls 550 to touch layers 590. The inventors have discovered that embodiments have increased reliability of the MEMS devices, due to the reduced forces placed upon solder balls 550 during backside processing.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

We claim:

1. A method for fabricating a multi-layer wafer level chip scale package for MEMS devices comprising:
   receiving a MEMS cap wafer comprising a plurality of MEMS capping structures, a MEMS device wafer comprising a plurality of MEMS dies, and a CMOS substrate wafer comprising a plurality of CMOS dies, wherein the CMOS substrate wafer is characterized by a first radius, wherein the MEMS device layer is characterized by a second radius, and wherein the MEMS cap wafer is characterized by a third radius, wherein the first radius is greater than the second radius, and wherein the second radius is greater than the third radius;
   forming a multi-layer wafer comprising the MEMS cap wafer disposed approximately concentrically upon the MEMS device wafer, and the MEMS device wafer disposed approximately concentrically upon the CMOS substrate wafer, wherein a MEMS device comprises a MEMS capping structure, a MEMS die and a CMOS die;
   disposing a spacer structure upon the multi-layer wafer, wherein the spacer structure comprises a plurality of proximity spacers disposed upon a proximity flag, wherein the plurality of proximity spacers are disposed upon the MEMS device layer;
   disposing a mask layer above and substantially parallel to the MEMS cap wafer, wherein the mask layer is disposed upon the plurality of proximity spacers; and
   forming a pattern upon the MEMS cap wafer using the mask layer.

2. The method of claim 1 wherein a width of the proximity spacer is smaller than an approximate difference between the second radius and the third radius.

3. The method of claim 1 wherein the pattern comprises a metallization pattern.

4. The method of claim 3 further comprising forming a metallization layer upon the MEMS cap wafer in response to the metallization pattern.

5. The method of claim 1:
   wherein the forming the pattern comprises forming a metallization pattern upon the MEMS cap wafer using the mask layer; and
   wherein the method further comprises disposing the multi-layer wafer within a back side processing tool, wherein the back side processing tool comprises a plurality of side-walls, and a cavity wall, wherein the multi-layer wafer is suspended by a front side of the CMOS substrate wafer by the plurality of side-walls, wherein the metallization pattern is disposed a distance away from the cavity wall, wherein the distance is within a range of about 0 to about 50 microns.

6. The method of claim 5 wherein the metallization layer is disposed a non-zero distance away from the cavity wall.

7. The method of claim 5 further comprising processing a back side of the CMOS wafer while the multi-layered wafer is disposed within the back side processing tool.

8. The method of claim 1 further comprising:
   forming a plurality of MEMS capping structures upon a first surface of an MEMS cap wafer; and
   forming a plurality of grooves in the first surface of the MEMS cap wafer, wherein the plurality of grooves are associated with the MEMS capping structure.

9. The method of claim 8
wherein the forming the pattern upon the MEMS cap wafer comprises forming the pattern upon a second surface of the MEMS cap wafer;
wherein the method further comprises singulating the MEMS device by applying a wafer saw to the second surface of the MEMS cap wafer at locations corresponding to the plurality of grooves formed in the first surface of the MEMS cap wafer, wherein chipping of the MEMS cap wafer is reduced by the plurality of grooves.

10. The method of claim 8
wherein forming the plurality of grooves in the first surface of the MEMS cap wafer comprises forming a plurality of multi-tiered grooves in the first surface of the MEMS cap.

11. A method for wafer level chip scale packages for MEMS devices comprising:
receiving a CMOS substrate wafer comprising a plurality of CMOS dies, wherein the CMOS substrate wafer is characterized by a first radius;
receiving a MEMS device wafer comprising a plurality of MEMS dies, wherein the MEMS device wafer is characterized by a second radius, and wherein the first radius exceeds the second radius;
disposing the MEMS device wafer approximately concentrically upon the CMOS substrate wafer;
receiving a MEMS cap wafer comprising a plurality of MEMS capping structures, wherein the MEMS cap wafer is characterized by a third radius, and wherein the second radius exceeds the third radius;
disposing the MEMS cap wafer approximately concentrically upon the MEMS device wafer, wherein a portion of the MEMS device wafer remains exposed;
disposing a spacer structure in contact with the portion of the MEMS device wafer;
disposing a first mask pattern above the MEMS cap wafer but not in contact therewith, wherein the first mask pattern contacts the spacer structure; and
forming a metallization layer upon the MEMS cap wafer using the first mask pattern;
wherein a MEMS device comprises a CMOS die, a MEMS die, and a MEMS capping structure.

12. The method of claim 11
wherein the spacer structure comprises a plurality of proximity spacers associated with a width; and
wherein the width is smaller than approximate difference between the second radius and the third radius.

13. The method of claim 11 wherein the metallization layer comprises a plurality of solder structures.

14. The method of claim 3 further wherein the plurality of solder structures comprises a plurality of solder balls.

15. The method of claim 13 wherein the method further comprises disposing the multi-layer wafer within a back side processing tool, wherein the back side processing tool comprises a plurality of side-walls, and a bottom cavity wall, wherein the multi-layer wafer is suspended by a front side of the CMOS substrate wafer by the plurality of side-walls, wherein the plurality of solder balls are disposed a distance away from the bottom cavity wall, wherein the distance is within a range of about 0 to about 50 microns, and wherein a back side of the CMOS substrate wafer is exposed.

16. The method of claim 15 further comprising processing the back side of the CMOS wafer while the multi-layered wafer is disposed within the back side processing tool.

17. The method of claim 11 further comprising:
forming a plurality of MEMS capping structures upon a first surface of a MEMS cap wafer; and
forming a plurality of grooves within the first surface of the MEMS cap wafer, wherein the plurality of grooves are associated with a MEMS capping structure.

18. The method of claim 17 wherein disposing the MEMS cap wafer approximately concentrically upon the MEMS device wafer comprises disposing the first surface of the MEMS cap wafer upon the MEMS device wafer.

19. The method of claim 17 further comprising applying a wafer saw to singulate the MEMS device at locations corresponding to grooves formed in the first surface of the MEMS cap wafer, wherein chipping of the MEMS cap wafer is reduced by the grooves.

20. The method of claim 17 wherein forming the plurality of grooves in the first surface of the MEMS cap wafer comprises forming a plurality of multi-tiered grooves in the first surface of the MEMS cap.

* * * * *